(12) United States Patent
Chen

(10) Patent No.: US 8,791,813 B2
(45) Date of Patent: Jul. 29, 2014

(54) MONITORING SYSTEM FOR TESTING APPARATUS

(75) Inventor: Dong Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 66 days.

(21) Appl. No.: 13/478,264

(22) Filed: May 23, 2012

(65) Prior Publication Data

US 2013/0038460 A1 Feb. 14, 2013

(30) Foreign Application Priority Data

Aug. 10, 2011 (CN) .......................... 2011 1 0228034

(51) Int. Cl.
 *G08B 29/00* (2006.01)
(52) U.S. Cl.
 USPC .......... 340/514; 73/865.9; 320/116; 340/635; 702/35; 702/108; 702/120
(58) Field of Classification Search
 USPC ........ 340/691.4, 691.6, 514, 635; 702/22, 35, 702/58, 59, 83, 120, 188, 121, 122, 187; 726/19; 714/25; 73/866.3, 865.9
 See application file for complete search history.

(56) References Cited

U.S. PATENT DOCUMENTS

| | | | | |
|---|---|---|---|---|
| 5,953,688 A | * | 9/1999 | Su et al. ........................ | 702/185 |
| 7,750,598 B2 | * | 7/2010 | Hoffman et al. .............. | 320/107 |
| 7,949,899 B2 | * | 5/2011 | Chen et al. ..................... | 714/25 |
| 2005/0114058 A1 | * | 5/2005 | Ono et al. ....................... | 702/83 |
| 2012/0274791 A1 | * | 11/2012 | Thomas et al. ............ | 348/207.1 |
| 2013/0289901 A1 | * | 10/2013 | Samreth ........................ | 702/58 |

\* cited by examiner

*Primary Examiner* — Brent Swarthout
(74) *Attorney, Agent, or Firm* — Novak Druce Connolly Bove + Quigg LLP

(57) ABSTRACT

A monitoring system includes a testing apparatus and a display control apparatus connected to the testing apparatus. The testing apparatus includes a plurality of testing locations and a collection module connected to the plurality of testing locations. Each of the plurality of testing locations receives a tested product, which is tested by the testing apparatus. The collection module collects testing states of the tested products. A display apparatus is connected to the display control apparatus. The display control apparatus controls the display apparatus to show a plurality of indicating blocks corresponding to the plurality of testing locations. The display apparatus is adapted to display the plurality of indicating blocks to match the plurality of testing locations. The display control apparatus controls each of the plurality of indicating blocks to show the testing state of the tested product in each the plurality of testing locations.

12 Claims, 3 Drawing Sheets

MONITORING SYSTEM FOR TESTING APPARATUS

TECHNICAL FIELD

The present disclosure relates to monitoring systems, and more particularly to a monitoring system for monitoring a testing apparatus.

DESCRIPTION OF RELATED ART

After electronic devices are manufactured there are test procedures that need to be performed. In a conventional testing process, the electronic devices are tested one by one, which is inefficient and time-consuming. In another conventional testing process, a testing apparatus is used to test a plurality of electronic devices simultaneously. However, because each of the electronic devices is different, while some electronic devices may have been tested completely, other electronic devices may be still under-tested. Therefore, the testing processes of the electronic devices are not automated and still needs to be monitored.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
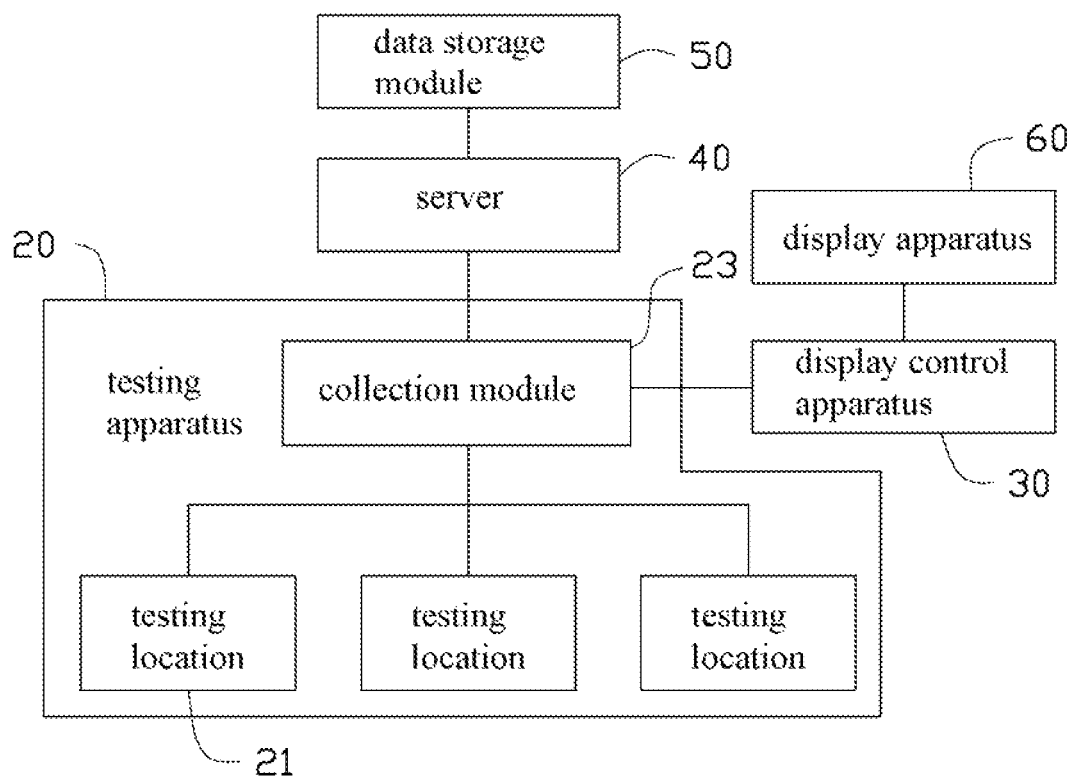
FIG. 1 is a block view of a monitoring system for a testing apparatus of an embodiment.

FIG. 1 shows a monitoring system in accordance with an embodiment including a testing apparatus 20, a display control apparatus 30, a server 40, a data storage module 50, and a display apparatus 60.

The testing apparatus 20 includes a plurality of testing locations 21. Each of the plurality of testing locations 21 receives a tested product, which is tested by the testing apparatus 20. The testing apparatus 20 further includes a collection module 23, which is connected to the plurality of testing locations 21. The collection module 23 collects testing information of the tested products. In one embodiment, the testing information includes a serial-number of each tested product, a testing state of each tested product, a testing result of each tested product, and testing fail reasons of each failed tested product. The testing state includes four states which are pre-tested state, under-tested state, completed-tested state, and tested fail state.

The display control apparatus 30 is connected to the collection module 23. The testing state information of each tested product is transmitted to the display control apparatus 30 by the collection module 23. The display control apparatus 30 is connected to the display apparatus 60.

Figure 2:
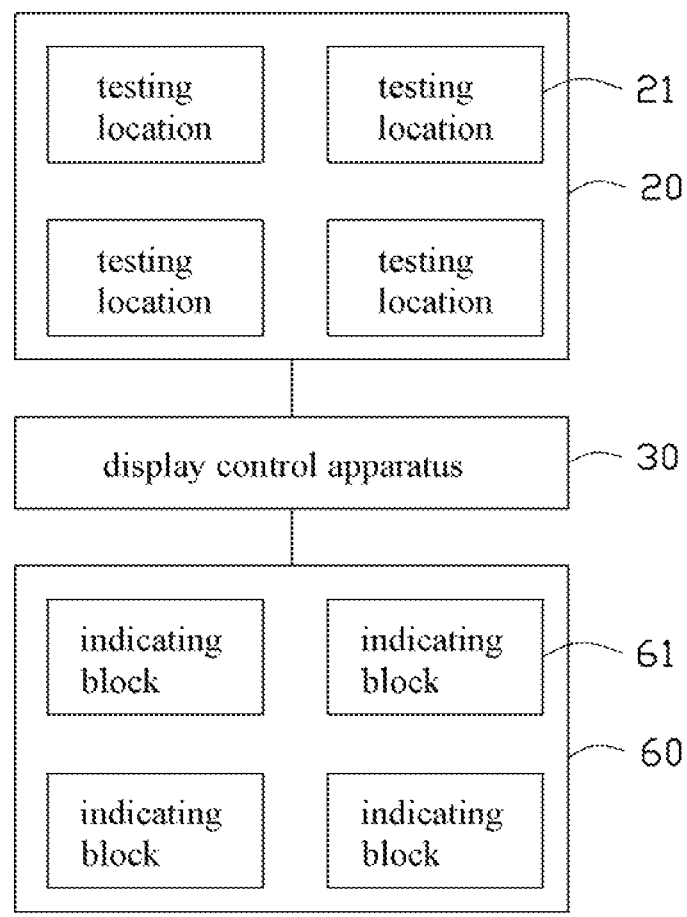
FIG. 2 is a block view of an embodiment of the testing apparatus and a monitoring apparatus of FIG. 1.

FIG. 2, shows the display control apparatus 30 controls the display apparatus 60 to display a plurality of indicating blocks 61 corresponding to the plurality of testing locations 21 of the testing apparatus 20. The plurality of indicating blocks 61 are located on the display apparatus 60 corresponding in a manner to match the plurality of testing locations 21 on the testing apparatus 20. For example, in one embodiment, the testing apparatus 20 includes four testing locations 21 positioned in two rows and two lines. The display apparatus 60 correspondingly displays four indicating blocks 61, which are similarly positioned. One indicating block 61 indicates one testing location 21 which has a similar position. For example, the indicating block 61, which is located on the first row and the first line on the display apparatus 60, indicates a testing state of the corresponding tested product located in the testing location 21 which is located on the corresponding first row and the first line on the testing apparatus 20. The indicating block 61, which is located on the first row and the second line on the display apparatus 70, corresponds to the testing location 21, correspondingly located with the row and line of the testing apparatus 20. Analogously, the indicating block 61, is similarly located on the display apparatus 70 corresponding to the testing location 21 which is similarly located on the testing apparatus 20.

Figure 3:
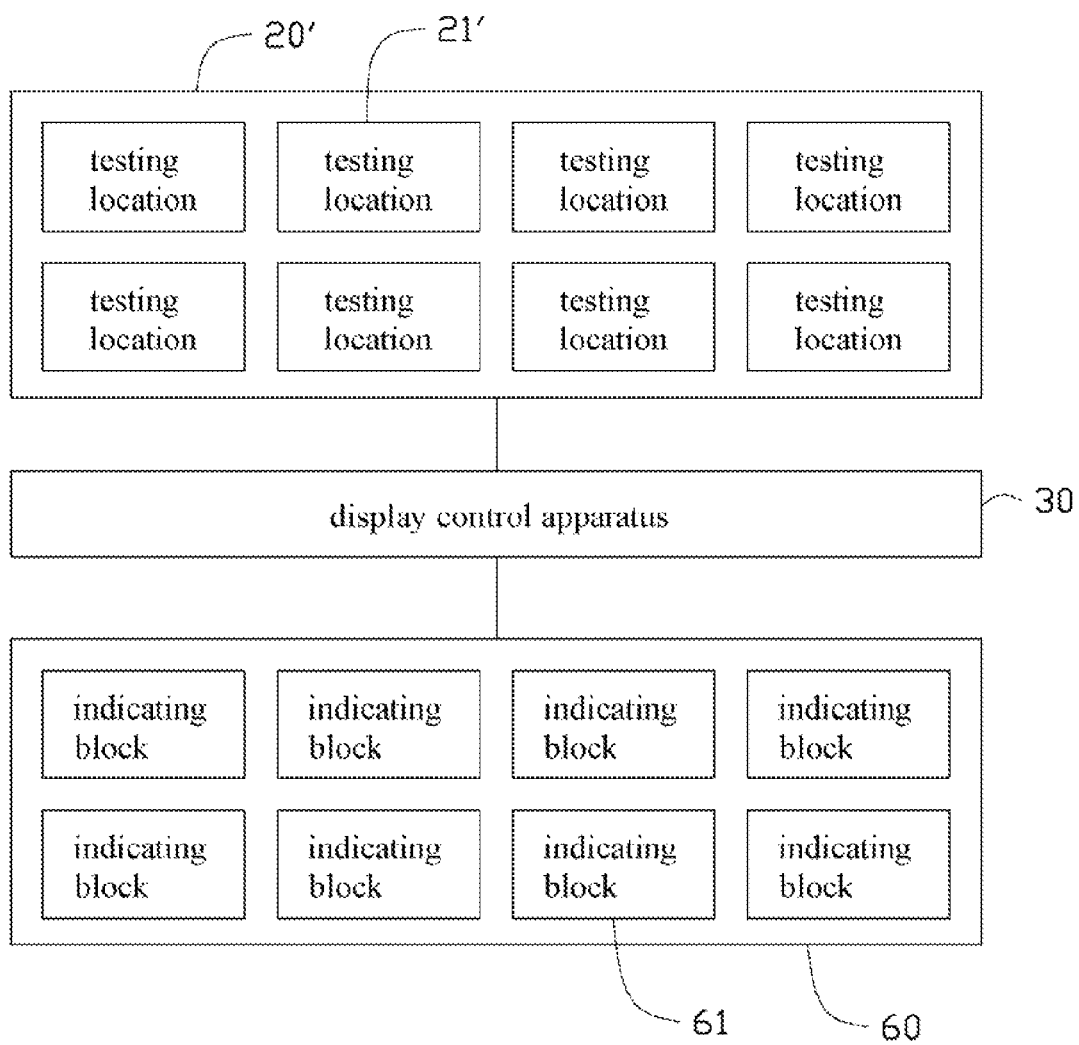
FIG. 3 is block view of another embodiment of the testing apparatus and a monitoring apparatus of FIG. 1.

FIG. 3, shows further, in another embodiment, another testing apparatus 20' includes eight testing locations 21'. The eight testing locations 21 are positioned in two rows and four lines. The display control apparatus 30 controls the display apparatus 60 correspondingly displaying eight indicating blocks 61 in the same manner.

The display control apparatus 30 controls the indicating block 61 to indicate different colors or symbols corresponding to different testing states of the corresponding tested product. For example, the indicating block 61 shows blue when in the pre-test state. The indicating block 61 shows yellow when in the under-test state. The indicating block 61 shows green when in the completed-test state. The indicating block 61 shows red when in the test fail state.

The server 40 is connected to the collection module 23. The collection module 23 transmits serial-numbers of tested products, test results, and test fail reasons to the server 40. The server 40 stores the information in the data storage device 50. The sever 40 can analyze the information.

The monitoring system can monitor testing state of each tested product via the indicating block 61, which is clear.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the invention to the full extent indicated by the broad general meaning of the terms in which the appended claims are expressed.

What is claimed is:

1. A monitoring system, comprising:
    a testing apparatus comprising a plurality of testing locations and a collection module connected to the plurality of testing locations, each of the plurality of testing locations being adapted to receive a tested product which is tested by the testing apparatus; the collection module being adapted to collect testing states of the tested products; and a display control apparatus connected to the collection module;

a display apparatus connected to the display control apparatus, the display control apparatus being adapted to control the display apparatus to show a plurality of indicating blocks corresponding to the plurality of testing locations, each of the indicating blocks having a respective position corresponding to each of the plurality of testing locations, the display apparatus being adapted to display the plurality of indicating blocks to match the plurality of testing locations, and the display control apparatus being adapted to control each of the plurality of indicating blocks to show the testing state of the tested product in each of the plurality of testing locations; and the collection module is further adapted to collect information of a serial-number of each of the tested products, a test result of each of the tested products, and reasons for failure of each of the tested products indicated to have failed a test.

2. The monitoring system of claim 1, wherein a number of the plurality of testing locations is same as a number of the plurality of indicating bocks.

3. The monitoring system of claim 2, wherein a first indicating block of the plurality of indicating blocks is adapted to indicate testing states of a first tested product in a first testing location of the plurality of testing locations, a relative location of the first testing location relative to the plurality of the testing locations is same as a relative location of the first indicating block relative to the plurality of indicating blocks.

4. The monitoring system of claim 1, wherein the testing states comprises states of pre-tested, states of under-tested, states of completed-tested, and states of test fail.

5. The monitoring system of claim 4, wherein each of the plurality of indicating block shows different colors to indicate each of the testing states.

6. The monitoring system of claim 1, further comprising a server, wherein the server receives the information and stores the information in a data storage module.

7. The monitoring system of claim 6, wherein the server is adapted to analyze the information.

8. A monitoring system, comprising:

a testing apparatus comprising a plurality of testing locations, each of the plurality of testing locations being adapted to receive a tested product which is tested by the testing apparatus;

a display apparatus connected to the testing apparatus, the display apparatus being adapted to display a plurality of indicating blocks; and a display control apparatus connected between the display apparatus and the collection module;

wherein a number of the plurality of testing locations is same as a number of the plurality of indicating bocks; the display apparatus is adapted to display the plurality of indicating blocks to match the plurality of testing locations; and a indicating block of the plurality of indicating blocks is adapted to indicate testing states of the tested product in a testing location of the plurality of testing locations, a relative location of the testing location relative to the testing apparatus being same as a relative location of the indicating block relative to the display apparatus, and the display control apparatus is adapted to control each of the plurality of indicating blocks to show the testing states of the tested product in each of the testing locations;

the testing apparatus comprises a collection module connected to the plurality of testing locations, and the collection module is adapted to collect testing states of the tested products; and the collection module is further adapted to collect information of a serial-number of each of the tested products, a testing result of each of the tested products, and reasons for failure of tested products indicated to have failed a test.

9. The monitoring system of claim 8, further comprising a server, wherein the server receives the information and stores the information in a data storage module.

10. The monitoring system of claim 8, wherein the server is adapted to analyze the information.

11. The monitoring system of claim 8, wherein testing states comprises states of pre-tested, states of under-tested, states of completed-tested, and states of test fail.

12. The monitoring system of claim 11, wherein each of the plurality of indicating blocks shows different colors to indicate each of the testing states.

* * * * *